United States Patent [19]
Sakai et al.

[11] Patent Number: 5,952,149
[45] Date of Patent: *Sep. 14, 1999

[54] RESIST SOLUTION FOR PHOTOLITHOGRAPHY INCLUDING A BASE RESIN AND AN OXYGEN-FREE OR LOW-OXYGEN SOLVENT

[75] Inventors: Keita Sakai; Keiko Chiba, both of Utsunomiya; Hiroshi Maehara, Yokohama, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/621,648

[22] Filed: Mar. 26, 1996

[30] Foreign Application Priority Data

Mar. 28, 1995 [JP] Japan .................................. 7-069612

[51] Int. Cl.⁶ ...................................................... G03C 1/73
[52] U.S. Cl. ......................................................... 430/270.1
[58] Field of Search ........................ 430/270.1; 210/750

[56] References Cited

U.S. PATENT DOCUMENTS

| | | | |
|---|---|---|---|
| 3,645,744 | 2/1972 | Fulkerson et al. | 430/270.1 |
| 4,419,437 | 12/1983 | Noonan et al. | 430/270.1 |
| 4,735,877 | 4/1988 | Kato et al. | 430/5 |
| 4,925,773 | 5/1990 | Miyamura et al. | 430/285.1 |
| 4,972,026 | 11/1990 | Armstrong et al. | 525/356 |
| 5,120,629 | 6/1992 | Bauer et al. | 430/270.1 |
| 5,164,278 | 11/1992 | Brunsvold et al. | 430/270.1 |
| 5,314,789 | 5/1994 | Hawkins et al. | 430/325 |
| 5,375,157 | 12/1994 | Maehara | 378/35 |
| 5,380,621 | 1/1995 | Dichiara et al. | 430/272.1 |
| 5,384,229 | 1/1995 | Pai et al. | 430/270.1 |
| 5,422,921 | 6/1995 | Chiba | 378/34 |
| 5,455,145 | 10/1995 | Tarumoto | 430/273.1 |
| 5,469,489 | 11/1995 | Miyake et al. | 378/35 |
| 5,482,817 | 1/1996 | Dichiara et al. | 430/271.1 |
| 5,485,495 | 1/1996 | Miyachi et al. | 378/34 |
| 5,571,419 | 11/1996 | Obata et al. | 210/750 |
| 5,599,650 | 2/1997 | Bi et al. | 430/281.1 |
| 5,607,816 | 3/1997 | Fitzgerald et al. | 430/281.1 |

*Primary Examiner*—Maria Nuzzolillo
*Assistant Examiner*—Laura Weiner
*Attorney, Agent, or Firm*—Fitzpatrick, Cella, Harper & Scinto

[57] ABSTRACT

A resist solution for photolithography includes a base resin and an oxygen-free or low-oxygen solvent, wherein an oxygen volume in 1 ml of the solution is 0.05 cm³ or less under atmospheric pressure.

5 Claims, 4 Drawing Sheets

RESIST APPLYING/DEVELOPING APPARATUS

HEAT TREATING APPARATUS

EXPOSURE APPARATUS

PRODUCTION FLOW OF SEMICONDUCTOR DEVICE

WAFER PROCESS

RESIST SOLUTION FOR PHOTOLITHOGRAPHY INCLUDING A BASE RESIN AND AN OXYGEN-FREE OR LOW-OXYGEN SOLVENT

BACKGROUND OF THE INVENTION

1. Field of the Invention

The present invention relates to a photoresist used in photolithography, and treatment techniques of the resist.

2. Related Background Art

There is no end to the pursuit of higher integration density of micro devices such as semiconductor devices, and processing applying the photolithography technology is demanded to achieve further finer patterning. Light sources used in exposure apparatus are thus switching from the conventional i-line light sources such as a mercury lamp to KrF and ArF excimer laser light sources of shorter wavelengths. Further, chemical amplification type resists with higher resolution are drawing attention as resists used in that case.

However, because the excimer laser light has very high irradiation energy, there is a possibility of taking place a reaction of a base resin itself, which did not take place with the conventional i-line. For example, in the case of the KrF excimer laser, novolak or polyvinyl phenol, used as a base resin of a resist, is oxidized by exposure to the KrF excimer laser. In more detail, activation energy of oxidation of the phenol is about $2.8 \times 10^{-20}$ (J), while energy (hv) of the KrF excimer laser is $8.01 \times 10^{-19}$ (J). This thus explains why the energy of the excimer laser causes the oxidation.

Quinones produced by this oxidation have absorption at wavelengths near 300 nm, and thus decrease the transmittance in the wavelength region of the KrF excimer laser. The decrease of transmittance will raise the problem that an adequate profile cannot be achieved when the resist is developed.

Further, the oxidation of the base resin will result in changing the dissolving rate thereof into a developer, which, in turn, will raise problems of changing the sensitivity and changing the resist line width transferred.

SUMMARY OF THE INVENTION

The present invention has been accomplished to solve the above problems, and an object of the invention is to enable high-accuracy pattern transfer while preventing a decrease of transmittance of a resist and suppressing the oxidation of a resist.

An aspect of the present invention, solving the above problems, is a resist composition characterized by using a low-oxygen or a oxygen-free solvent.

A low-oxygen state mentioned herein means that an oxygen volume in 1 ml of a solution is preferably 0.05 cm$^3$ or less under an atmospheric pressure, and more preferably 0.03 cm$^3$ or less.

A solvent used in the resist may be one of the of types solvents used in the conventional resists. These solvents are, for example, ethylene glycol based solvents such as ethylene glycol monomethyl ether, ethylene glycol monoethyl ether, and diethylene glycol dimethyl ether, and acetic esters thereof, including ethylene glycol monomethyl ether acetate and ethylene glycol monoethyl ether acetate; propylene glycol based solvents such as propylene glycol monomethyl ether and propylene glycol monoethyl ether, and acetic esters thereof, including propylene glycol monomethyl ether acetate and propylene glycol monoethyl ether acetate; aliphatic ketones such as acetone, methyl ethyl ketone, methyl isobutyl ketone, pentanone, and isoamyl acetate, alicyclic ketones such as cyclohexane, aromatic compounds such as toluene and xylene, etc., which can be used singly or as a mixture. It is noted that any other solvent than these solvents can be used without any specific limitations as long as it can dissolve solid components of the resist.

Another aspect of the present invention is characterized in that an antioxidant is contained in the resist composition.

The antioxidant may be one selected from monophenol based compounds such as 2,6-di-t-butyl-p-cresol, bisphenol based compounds such as 2,2' methylene bis(4-methyl-6-t-butylphenol), and polymer type phenol based compounds such as 1,1,3-tris(2-methyl-4-hydroxy-5-t-butylphenyl)butane. Furthermore, the antioxidant may be one selected from sulfur based antioxidants such as dilauryl 3,3' thiodipropionate, and phosphorus based antioxidants such as triphenylphosphite. In addition, the antioxidant may be one selected from compounds including erythorbic acid, isopropyl citrate, and nordihydroguaiaretic acid.

Still another aspect of the present invention is characterized in that an environment for performing at least one of an application treatment of the resist, a heat treatment, an exposure treatment, and a development treatment is controlled in a low-oxygen or oxygen-free state using, for example, an inert gas.

An example of a method for controlling the environment in the low-oxygen or oxygen-free state is to replace the air in the apparatus with the inert gas. Preferred examples of the inert gas applicable herein are neon, argon, krypton, xenon, radon, nitrogen, helium, and so on.

DESCRIPTION OF THE PREFERRED EMBODIMENTS

<Embodiments of Treatment Apparatus>

Figure 1:
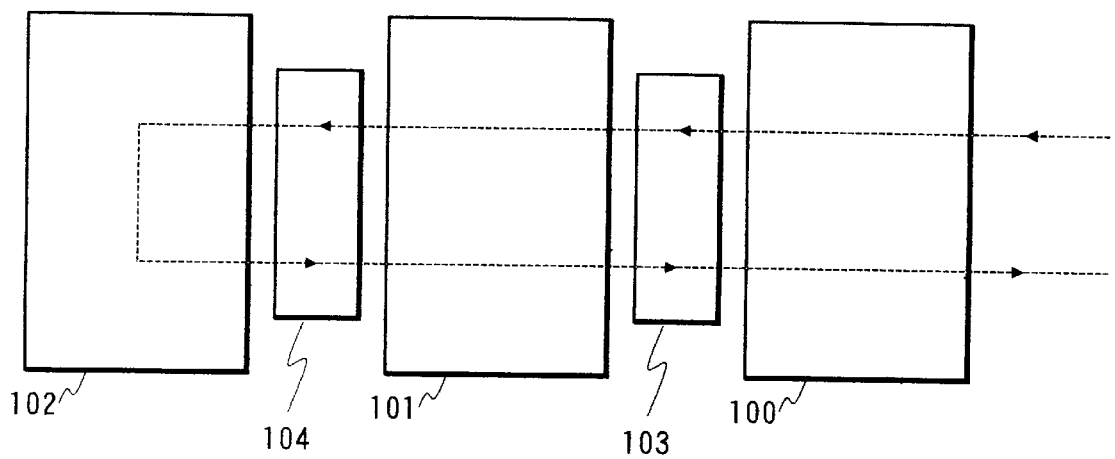
FIG. 1 is a schematic drawing to show a production line of a device.

The embodiments of the present invention will be explained. FIG. 1 is a schematic drawing of a production line for producing micro-devices such as semiconductor products, in which there are a resist applying/developing apparatus 100, a resist heat-treating apparatus 101, and an exposure apparatus 102 arranged in order and in which in-line interfaces 103, 104 for transfer of a substrate are provided between respective ones of the apparatus. A substrate is carried along a direction shown by the arrows in the drawing to be processed in order by the apparatus.

Figure 2:
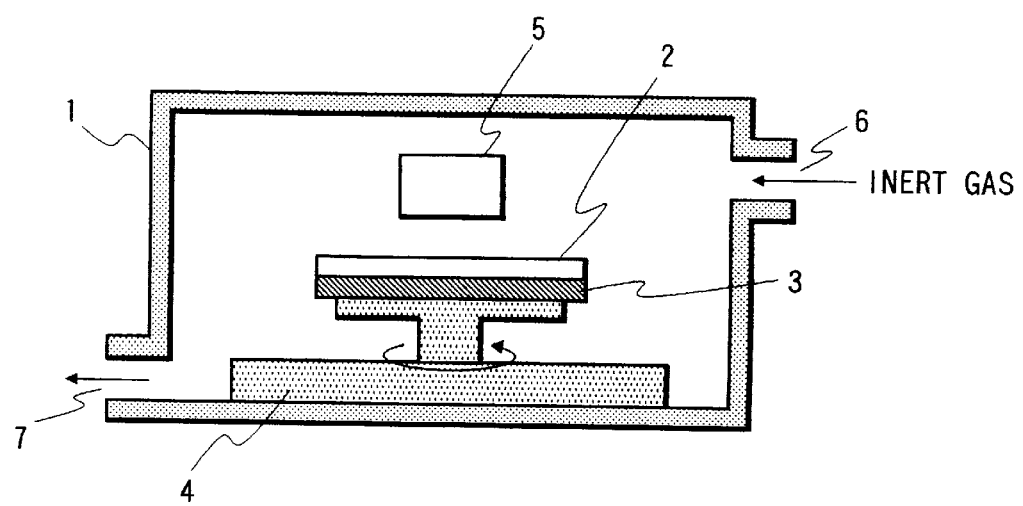
FIG. 2 is a schematic drawing of a resist applying apparatus.

FIG. 2 is a schematic drawing of the resist applying/developing apparatus (coater developer), in which numeral 1 denotes a chamber, 2 the resist, 3 the wafer substrate, and 4 a spinner for rotating the wafer substrate mounted thereon. A device 5 for dropping a resist solution or a resist developer is set above the spinner 4. In this arrangement, when the resist solution or the developer drops onto the wafer substrate 3 rotated by the spinner 4, the centrifugal force evenly spreads the liquid on the surface of the substrate. The chamber 1 is provided with an inlet 6 and an outlet 7 for the inert gas (for example, neon, argon, krypton, xenon, radon, nitrogen, or helium).

Although the drawing shows the separate resist applying/developing apparatus 100 and heat-treating apparatus 101, they may be incorporated into a single apparatus.

Figure 3:
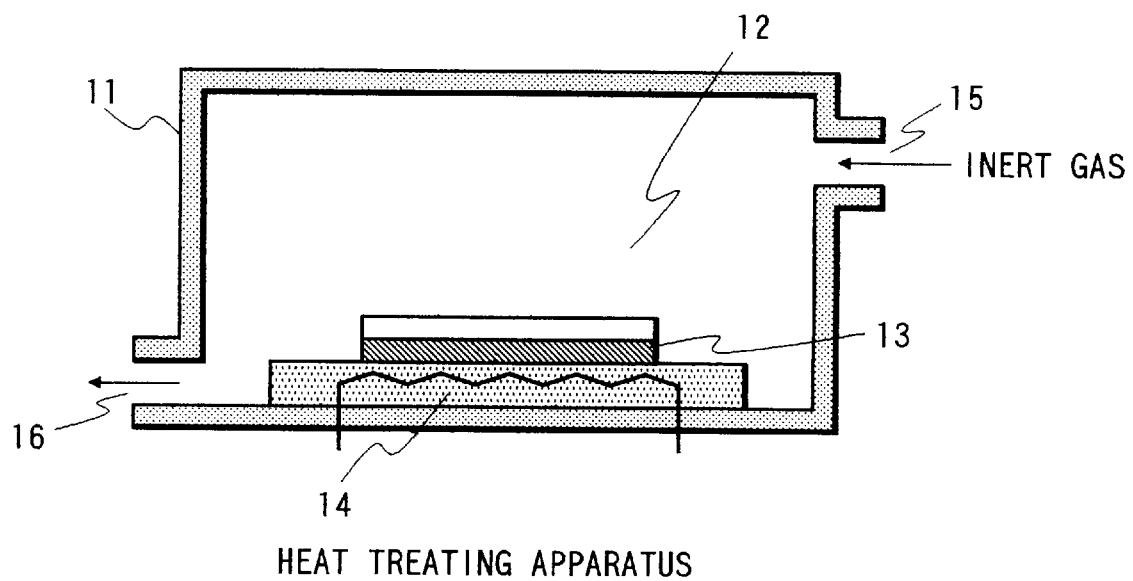
FIG. 3 is a schematic drawing of a heat-treating apparatus.

FIG. 3 is a schematic drawing of the resist heat-treating apparatus, in which reference numeral 11 designates a chamber, 12 the resist, 13 the wafer, and 14 a hot plate. The chamber 11 is provided with an inlet 15 and an outlet 16 for the inert gas (for example, neon, argon, krypton, xenon, radon, nitrogen, or helium).

Figure 4:
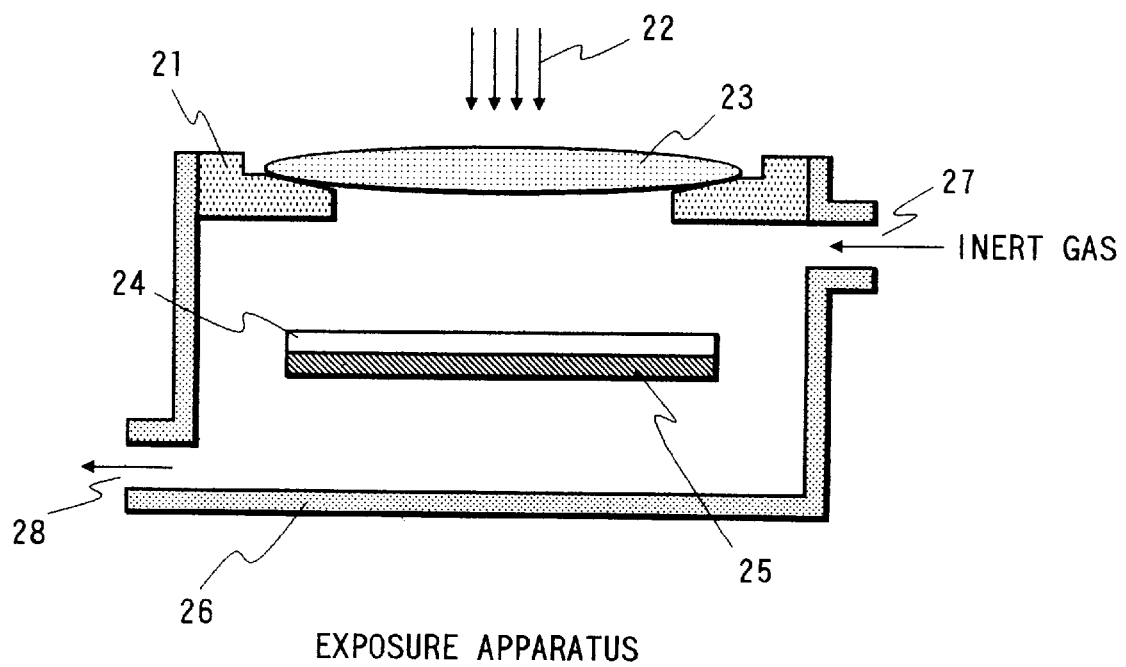
FIG. 4 is a schematic drawing of an exposure apparatus.

FIG. 4 is a schematic drawing of the resist exposure apparatus, in which reference numeral 21 is a lens barrel, 22 KrF or ArF excimer laser light, 23 a lens, 24 the resist, 25 the wafer, and 26 a chamber. The chamber 26 is provided with an inlet 27 and an outlet 28 for the inert gas (for example, neon, argon, krypton, xenon, radon, nitrogen, or helium).

The following describes examples of the resist treatments in the respective apparatus in the above production line.

EXAMPLE 1

The resist was a chemical amplification type resist. The base resin was novolak, a crosslinking agent was hexamethylolmelamine, and a photoacid generator was an onium salt. These were also used in Example 2 and subsequent examples as described below.

First, the solvent, ethylene glycol monoethyl ether acetate, was subjected to nitrogen bubbling to lower the concentration of oxygen, thereby obtaining a resist solution of the low-oxygen or oxygen-free resist composition.

After that, using the resist applying/developing apparatus of FIG. 2, the resist solution was dropped while rotating the wafer by the spinner 4, thereby evenly applying the resist on the wafer. Pre-bake was next carried out on the hot plate 14, using the heat-treating apparatus of FIG. 3. Then, using the exposure apparatus of FIG. 4, the wafer was subjected to exposure to the KrF excimer laser light to effect transfer of a pattern of a reticle (not shown). After the exposure transfer, post-exposure bake was carried out on the hot plate in the apparatus of FIG. 3. After that, using the resist applying/developing apparatus of FIG. 2, the developer was dropped onto the resist while rotating the wafer by the spinner 4, thereby performing the development treatment.

Using the ultraviolet and visible spectrophotometer, the spectral transmittance of the resist film was measured in the wavelength region of 400 nm or less, and it was confirmed that the transmittance of the resist using the low-oxygen solvent of this example showed no change before and after the exposure.

Next, using a Fourier transform infrared spectrophotometer (FTIR), infrared absorption was measured of the quinones resulting from the oxidation of the base resin. The wave numbers were near 1700 cm$^{-1}$ and 1200 cm$^{-1}$. The results assured that the resist using the low-oxygen or oxygen-free solvent of this example was more restrained in oxidation than the resists using the conventional solvents.

Namely, it was confirmed that the present example using the chemical amplification type resist with the low-oxygen solvent realized high-accuracy pattern transfer without lowering the transmittance of the resist, while suppressing the oxidation of the resist.

EXAMPLE 2

2,6-di-t-butyl-p-cresol was added as an antioxidant into the resist solution and the resultant solution was applied onto the wafer, using the apparatus of FIG. 2. Subsequently, conducted were the pre-bake in the apparatus of FIG. 3, the exposure transfer in the exposure apparatus of FIG. 4, the post-exposure bake in the apparatus of FIG. 3, and the development treatment in the apparatus of FIG. 2.

The spectral transmittance of the resist film was measured in the wavelength region of 400 nm or less, using the ultraviolet and visible spectrophotometer, which assured that the transmittance of the resist with the antioxidant mixed therein showed no change before and after the exposure.

Next, using the Fourier transform infrared spectrophotometer (FTIR), infrared absorption was measured of the quinones resulting from the oxidation of the base resin. The results showed that the resist with the antioxidant mixed therein was more restrained in oxidation than the resist without mixture of the antioxidant.

Namely, it was confirmed that the present example using the resist in which the resist composition contained the antioxidant realized high-accuracy pattern transfer without lowering the transmittance of the resist, while suppressing the oxidation of the resist.

EXAMPLE 3

The chamber 1 of the resist applying/developing apparatus of FIG. 2 was filled with an inert gas ($N_2$) to produce an environment controlled in the low-oxygen or oxygen-free state. The resist was applied onto the wafer under this atmosphere. After that, conducted were the pre-bake, the exposure transfer, and the post-exposure bake. Then, a wafer was introduced into the resist applying/developing apparatus to be developed under the atmosphere of the above inert gas.

The spectral transmittance of the resist film was measured in the wavelength region of 400 nm or less with the ultraviolet and visible spectrophotometer, which assured that the transmittance of the resist applied in the inert gas atmosphere showed no change before and after exposure.

Next, using the Fourier transform infrared spectrophotometer (FTIR), infrared absorption was measured of the quinones resulting from the oxidation of the base resin. The results showed that the resist applied in the inert gas atmosphere was more restrained in oxidation than the resist coated in the air.

Namely, it was confirmed that the present example arranged to perform the application treatment and development treatment of the resist under the environment filled with the inert gas and thus controlled in the low-oxygen or oxygen-free state realized high-accuracy pattern transfer without lowering the transmittance of the resist while suppressing the oxidation of the resist.

EXAMPLE 4

The chamber 11 of the resist heat-treating apparatus of FIG. 3 was filled with an inert gas ($N_2$) to produce an environment controlled in the low-oxygen or oxygen-free state. The wafer coated with the resist was introduced into the resist heat-treating apparatus of FIG. 3 and was pre-baked in the inert gas atmosphere. Subsequently, exposure transfer was carried out and post-exposure bake was conducted again in the inert gas atmosphere. After that, development was carried out.

The spectral transmittance of the resist film was measured in the wavelength region of 400 nm or less with the ultraviolet and visible spectrophotometer, which assured that the transmittance of the resist heat-treated in the inert gas atmosphere showed no change before and after exposure.

Next, using the Fourier transform infrared spectrophotometer (FTIR), infrared absorption was measured of the quinones resulting from the oxidation of the base resin. The results showed that the resist heat-treated in the inert gas atmosphere was more restrained in oxidation than the resist heat-treated in the air.

Namely, it was confirmed that the present example for performing the heat treatment of the resist under the environment filled with the inert gas and thus controlled in the low-oxygen or oxygen-free state realized high-accuracy pattern transfer without lowering the transmittance of the resist, while suppressing the oxidation of the resist.

EXAMPLE 5

The chamber 21 of the exposure apparatus of FIG. 4 was filled with an inert gas ($N_2$) to produce an environment controlled in the low-oxygen or oxygen-free state. The wafer after coated with the resist and pre-baked was introduced into the chamber of the KrF excimer exposure apparatus under the inert gas atmosphere and exposure transfer was conducted under the atmosphere. After that, post-exposure bake and development treatment were carried out.

The spectral transmittance of the resist film was measured in the wavelength region of 400 nm or less with the ultraviolet and visible spectrophotometer, which assured that the transmittance of the resist exposed in the inert gas atmosphere showed no change before and after exposure.

Next, using the Fourier transform infrared spectrophotometer (FTIR), infrared absorption was measured of the quinones resulting from the oxidation of the base resin. The results showed that the resist exposed in the inert gas atmosphere was more restrained in oxidation than the resist exposed in the air.

Namely, it was confirmed that the present example for performing exposure of the resist in the environment filled with the inert gas and thus controlled in the low-oxygen or oxygen-free state realized high-accuracy pattern transfer without lowering the transmittance of the resist, while suppressing the oxidation of the resist.

EXAMPLE 6

The present example satisfied the conditions including all the features of the above examples, in which the resist was the chemical amplification type resist obtained by adding the antioxidant in the low-oxygen or oxygen-free solvent and in which all the resist applying treatment, resist heat treatment, exposure treatment, and development treatment were carried out under the inert gas atmosphere. The same measurements as in the above examples were carried out using the ultraviolet spectrophotometer and infrared spectrophotometer, and the results showed that the present example was able to decrease most of the change of transmittance of the resist and the oxidation of the resist.

Namely, it was confirmed that the present example satisfying all the conditions of the above examples realized extremely high accuracy pattern transfer without lowering the transmittance of the resist, while most suppressing the oxidation of the resist.

EXAMPLE 7

Figure 5:
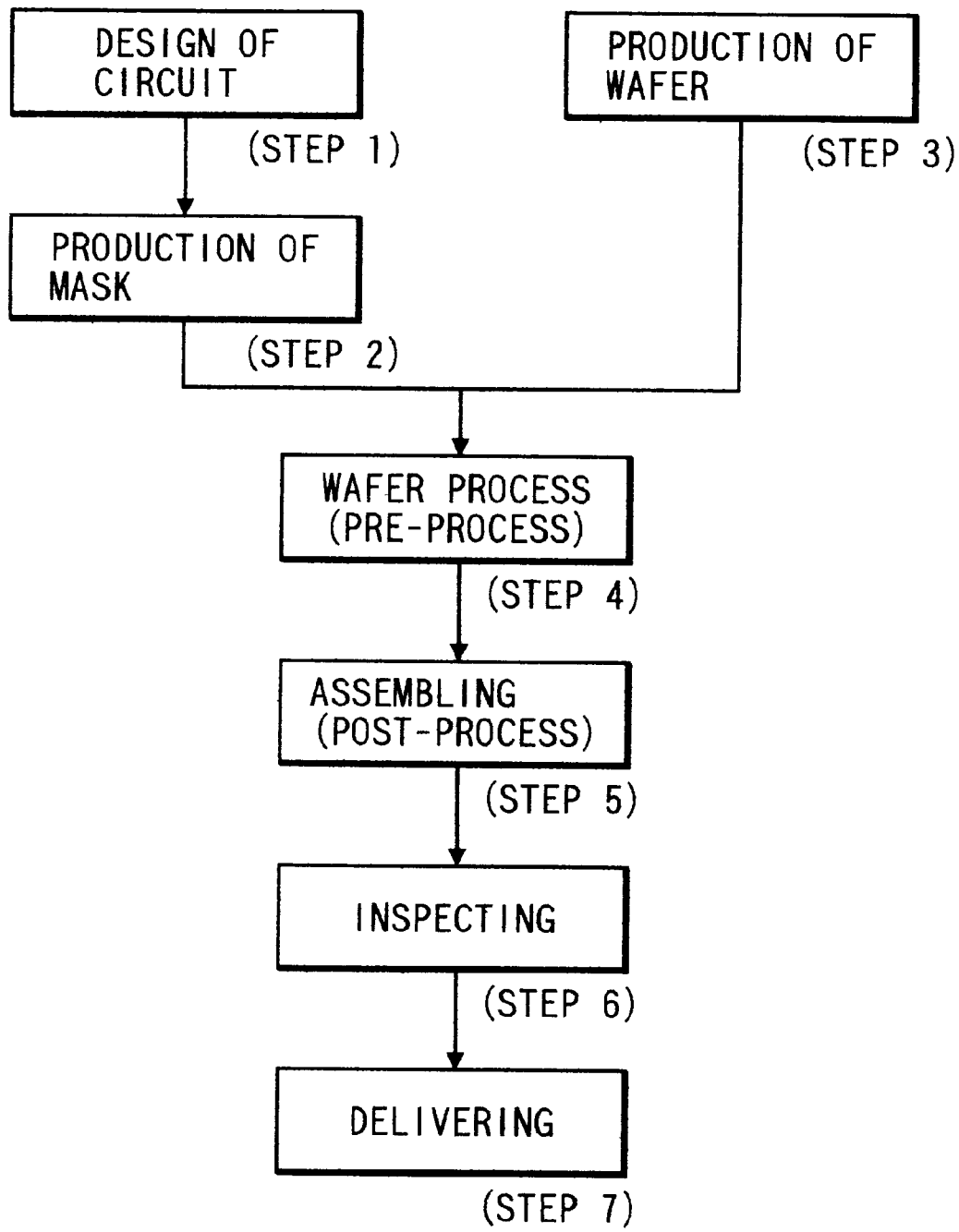
FIG. 5 is a drawing to show a flow for fabricating semiconductor devices.

Next explained is an example of a process for fabricating semiconductor devices. FIG. 5 is a flowchart to show a fabrication flow of semiconductor devices (e.g., semiconductor chips such as IC's or LSI's, liquid crystal panels or CCD's, thin-film magnetic heads, microsyringes, etc.).

At step 1 (design of circuit) the design of a circuit of a semiconductor device is carried out. At step 2 (production of mask) a mask structure is fabricated with the designed circuit pattern formed therein. On the other hand, a wafer is fabricated using a material such as silicon at step 3 (production of wafer). Step 4 (wafer process) is called a pre-process, in which actual circuits are formed on the wafer by the photolithography technology using the mask structure and wafer thus prepared. Next, step 5 (assembling) is called a post-process, which is a step for obtaining semiconductor chips from the wafer fabricated at step 4, and which includes an assembling step (dicing and bonding) and a packaging step. Step 6 (inspection) is a step for inspecting the semiconductor devices produced at step 5 by operation checking tests, durability tests, etc., thereof. The semiconductor devices are completed through the above steps and are shipped (step 7).

Figure 6:
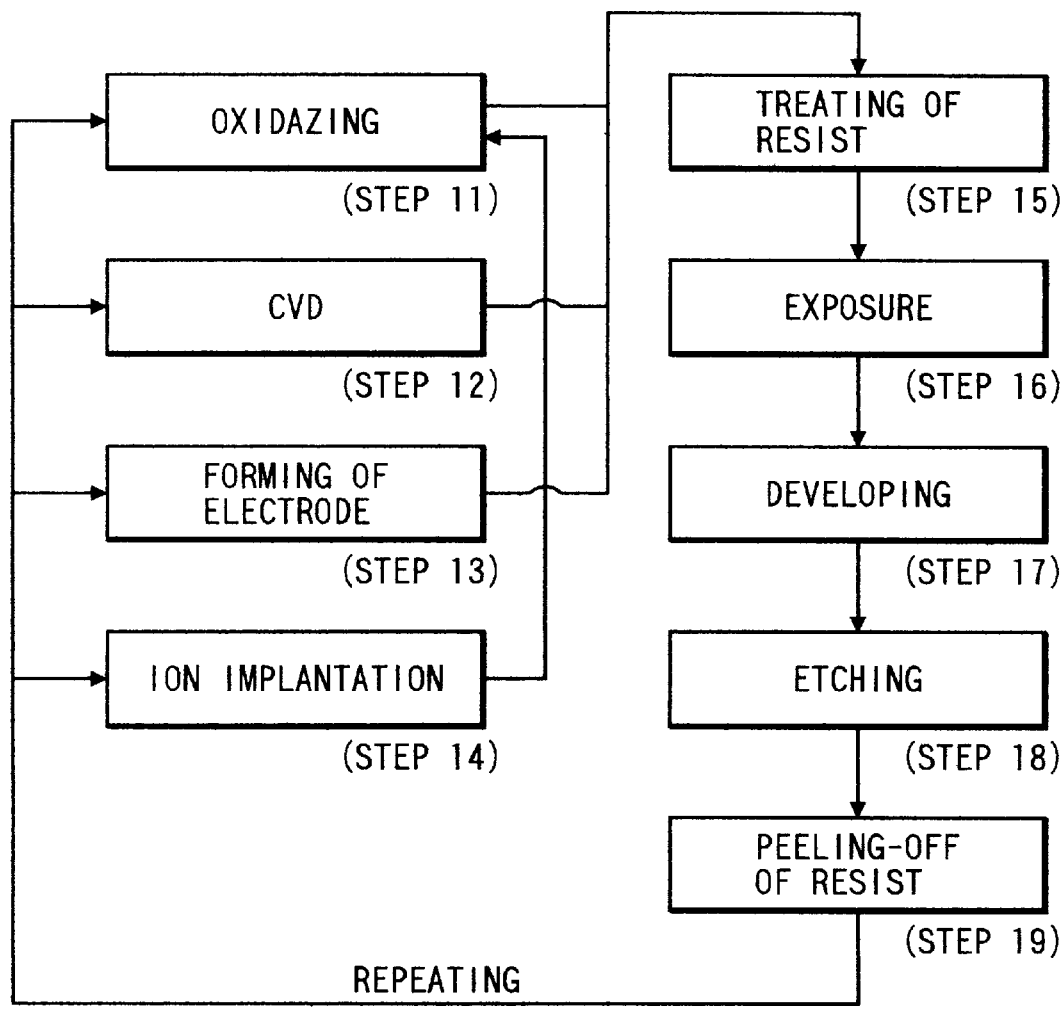
FIG. 6 is a drawing to show a flow of a wafer process.

FIG. 6 shows the detailed flow of the above wafer process. At step 11 (oxidation) the surface of the wafer is oxidized. At step 12 (CVD) an insulating film is formed on the surface of the wafer. At step 13 (formation of electrodes) the electrodes are formed by vapor deposition on the wafer. At step 14 (ion implantation) ions are implanted into the wafer. At step 15 (resist treatment) the wafer is coated with the resist. At step 16 (exposure) the circuit pattern of the mask is printed in the wafer by the excimer exposure method as explained previously. At step 17 (development) the wafer after exposure is developed. At step 18 (etching) etching is carried out to remove portions other than the resist image developed. At step 19 (resist stripping) the resist after etching is removed. By repeating these steps, multiple circuit patterns are formed on the wafer.

Use of the production process according to the present invention permits semiconductor devices of high integration density, which were previously difficult to obtain by the conventional fabrication process, to be produced.

What is claimed is:

1. A resist solution for photolithography, said solution comprising:

a base resin; and an oxygen-free or low-oxygen solvent in which oxygen is removed or reduced by nitrogen bubbling, wherein an oxygen volume in 1 ml of the solution is 0.05 $cm^3$ or less under atmospheric pressure.

2. A resist solution according to claim 1, wherein the oxygen-free or low-oxygen solvent has an oxygen volume in 1 ml of solution of 0.03 $cm^3$ or less under atmospheric pressure.

3. A resist solution according to claim 1, wherein said solution is used to produce a resist, which is a chemical amplification resist.

4. A wafer having a resist film comprising a resist composition made using the resist solution as set forth in any one of claims 1 to 3.

5. A resist solution according to claim 1, wherein the photolithography is excimer laser photolithography.

* * * * *

UNITED STATES PATENT AND TRADEMARK OFFICE
CERTIFICATE OF CORRECTION

PATENT NO. : 5,952,149

DATED : September 14, 1999

INVENTOR(S): KEITA SAKAI, ET AL.

It is certified that error appears in the above-identified patent and that said Letters Patent is hereby corrected as shown below:

IN THE DRAWINGS:

SHEET NO. 4:
Figure 6, "OXIDAZING" should read --OXIDIZING--.

COLUMN 1:
Line 51, "a" should read --an--; and
Line 57, "of types" should read --types of--.

COLUMN 5:
Line 18, "coated" should read --being coated--.

Signed and Sealed this

Thirtieth Day of May, 2000

*Attest:*

Q. TODD DICKINSON

*Attesting Officer*      *Director of Patents and Trademarks*